United States Patent
Tian et al.

(10) Patent No.: US 12,501,648 B2
(45) Date of Patent: Dec. 16, 2025

(54) HV DEVICE AND METHOD FOR MANUFACTURING SAME

(71) Applicant: Shanghai Huali Integrated Circuit Corporation, Shanghai (CN)

(72) Inventors: Zhi Tian, Shanghai (CN); Hua Shao, Shanghai (CN); Haoyu Chen, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 350 days.

(21) Appl. No.: 18/451,510

(22) Filed: Aug. 17, 2023

(65) Prior Publication Data
US 2024/0170573 A1    May 23, 2024

(30) Foreign Application Priority Data

Nov. 18, 2022    (CN) .......................... 202211457694.2

(51) Int. Cl.
*H10D 30/01* (2025.01)
*H10D 30/60* (2025.01)
*H10D 30/65* (2025.01)
*H10D 62/10* (2025.01)
*H10D 62/13* (2025.01)
*H10D 64/27* (2025.01)

(52) U.S. Cl.
CPC ......... *H10D 30/65* (2025.01); *H10D 30/0221* (2025.01); *H10D 30/0281* (2025.01); *H10D 30/603* (2025.01); *H10D 62/116* (2025.01); *H10D 62/157* (2025.01); *H10D 64/513* (2025.01)

(58) Field of Classification Search
CPC ............. H10D 30/0221; H10D 30/603; H10D 30/0281; H10D 30/65; H10D 30/0289; H10D 30/658; H10D 62/116; H10D 64/513

See application file for complete search history.

(56) References Cited

U.S. PATENT DOCUMENTS

| | | | |
|---|---|---|---|
| 12,453,120 B2* | 10/2025 | Tian ..................... | H10D 62/116 |
| 2010/0270616 A1* | 10/2010 | Yanagi ................ | H10D 30/603 |
| | | | 438/689 |
| 2012/0313166 A1* | 12/2012 | Ito ....................... | H10D 30/603 |
| | | | 257/E29.256 |
| 2015/0076555 A1* | 3/2015 | Yang ................... | H10D 62/116 |
| | | | 257/141 |
| 2016/0372360 A1* | 12/2016 | Fang ................. | H01L 21/76232 |
| 2019/0103471 A1* | 4/2019 | Aghoram .......... | H01L 21/02502 |

* cited by examiner

*Primary Examiner* — Yu Chen
(74) *Attorney, Agent, or Firm* — Banner & Witcoff, Ltd.

(57) ABSTRACT

The present application discloses an HV device, comprising: a gate dielectric layer formed in a first trench and a second dielectric layer formed in a second trench. A second side face of a drain shallow trench isolation is aligned with a first side face of the first trench. A second side face of the second trench is aligned with a first side face of the drain shallow trench isolation. A drain high voltage diffusion region is formed in a first high voltage well region, and the drain shallow trench isolation is located in the drain high voltage diffusion region. A drain region is formed in a surface region of the drain high voltage diffusion region outside the first side face of the second dielectric layer. The present application also discloses a method for manufacturing an HV device.

8 Claims, 3 Drawing Sheets

HV DEVICE AND METHOD FOR MANUFACTURING SAME

CROSS-REFERENCES TO RELATED APPLICATIONS

This application claims the priority to Chinese patent application No. 202211457694.2, filed on Nov. 18, 2022, and entitled "HV DEVICE AND METHOD FOR MANUFACTURING SAME", the disclosure of which is incorporated herein by reference in its entirety.

TECHNICAL FIELD

The present application is related to the field of semiconductor integrated circuits manufacturing, in particular, it is related to a high voltage (HV) device and a method for manufacturing an HV device.

BACKGROUND

In the third-generation display technology, an organic light emitting diode (OLED) display is a current-injection composite light emitting type which has main advantages such as high brightness, high contrast, wide viewing angle, fast response speed, low operating voltage, strong adaptability, high energy conversion efficiency, and simple manufacturing process. The OLED attracts widespread attention from both academia and industry from its significant technological advantages and application prospects.

The OLED is a current-driven type of displays, and the current density of the OLED depends on a driving voltage between two ends, where a higher voltage results in a larger current density. OLED devices age during its long-term use, so the relationship between voltage, current density, and light emitting brightness may not always remain constant. The most direct manifestation of the OLED device ageing is an increase in its OLED switch-on voltage and a decrease in its light emitting efficiency. To maintain the same light emitting brightness, it is necessary to increase the current flowing through the OLED, so a high voltage device is required in the OLED to achieve the function of a high current.

In addition, the internal storage capability of the OLED is limited, so it is necessary to add an external memory to store image data. Among the choices, static random access memory (SRAM) has become a commonly accepted memory in the OLED because of its high read-write speed and capability of maintaining data without a refresh operation during a power-on period.

The OLED technology combined with advanced IC logic device technology has been continuously developing. Currently, the advanced technology (commonly referred to as 28-nanometer) in mass production includes a high dielectric-constant material combined with a metal gate (28HV MG), which can utilize the high performance and low voltage of this advanced node. In the 28HV MG technology, it is necessary to integrate a low voltage SRAM and a high voltage driving device. However, the high voltage requires the use of thick silicon oxide as a gate dielectric layer, and a thick gate dielectric layer affects subsequent processes of the metal gate. A low voltage (LV) device adopts a thinner gate dielectric layer, such as a gate oxide layer, with source and drain regions formed in a semiconductor substrate on two sides of the gate structure in a self-aligned manner. A withstand voltage of a medium voltage (MV) device is higher than that of a low voltage (LV) device, and the thickness of a gate dielectric layer of the MV device is greater than the thickness of the gate dielectric layer of the LV device. An HV device requires a thicker gate dielectric layer, and requires the provision of a shallow trench isolation (STI) in a drain structure, that is, the drain structure of the HV device further includes a drain shallow trench isolation, so as to achieve a higher withstand voltage.

To make the fabrication process compatible with the current metal gate technology, in particular a step of etching back needs to be performed in a high voltage (HV) region to form a recess for an active region, after the step, a thick silicon oxide can be grown such that the height thereof can be close to that of the active region as much as possible, thereby facilitating subsequent process development. FIGS. 1A-1C are schematic diagrams of the device structures obtained in steps of forming a gate dielectric layer in an existing method for manufacturing an HV device. The steps of forming the gate dielectric layer in the existing method for manufacturing an HV device include the following:

Referring to FIG. 1A, a semiconductor substrate 101 is provided, a shallow trench isolation 102 is formed on the semiconductor substrate 101, and the semiconductor substrate 101 in a region enclosed by the shallow trench isolations 102 is an active region.

A hard mask layer 103 is formed on the surface of the semiconductor substrate 101, the material of the hard mask layer 103 includes silicon nitride.

A lithography process is performed to form a photoresist pattern 104, wherein the photoresist pattern 104 is defined by using the mask of a gate conductive material layer, and therefore, a region opened by the photoresist pattern 104 is a formation region of the gate conductive material layer.

Referring to FIG. 1B, the semiconductor substrate 101 in the region opened by the photoresist pattern 104 is etched to form a trench 105, wherein the trench 105 is formed in an overlap region of the active region between the photoresist pattern 104 (not shown in FIG. 1B) and the shallow trench isolation 102.

Referring to FIG. 1C, the trench 105 is filled with a dielectric layer, such as silicon oxide, so as to form a gate dielectric layer 106.

A field diffusion drain (FDD) structure is used in the high voltage (HV) device of advanced process such as the 28-nanometer one. The source and the drain in a symmetrical structure each include a shallow trench isolation (STI) structure, while in an asymmetrical structure only a drain field diffusion region includes an STI. When the device is turned on, a current flows near the STI and is transmitted. In an actual process, the corresponding reliability deteriorates due to an angle and an interface of the STI.

FIG. 2 is a schematic diagram of a structure in an existing HV device. FIG. 3 is a schematic layout top view of the existing HV device. In FIG. 2, the existing HV device is illustrated using an asymmetrical structure and an N-type device as an example. The existing HV device includes:

a gate dielectric layer 208, wherein the gate dielectric layer 208 is formed in a trench 211, the trench 211 is formed by etching a semiconductor substrate 201, and a top surface of the gate dielectric layer 208 is flush with a top surface of the semiconductor substrate 201.

A gate conductive material layer 209 is formed on the surface of the gate dielectric layer 208. A sidewall spacer 210 is formed on a side face of the gate conductive material layer 209.

The material of the gate dielectric layer 208 includes silicon oxide.

The gate conductive material layer 209 includes a metal gate.

A first high voltage well region 203 doped with a second conductivity type is formed on the semiconductor substrate 201.

A drain structure is formed in the first high voltage well region 203 outside a first side face of the gate dielectric layer 208, and a source structure is formed in the first high voltage well region 203 outside a second side face of the gate dielectric layer 208.

The drain structure includes a drain high voltage diffusion region 204a doped with a first conductivity type, a drain shallow trench isolation 202a, and a drain region 206a heavily doped with the first conductivity type.

The drain high voltage diffusion region 204a is formed in the first high voltage well region 203. The drain shallow trench isolation 202a is located in the drain high voltage diffusion region 204a. A second side face of the drain shallow trench isolation 202a is aligned with a first side face of the trench 211. The depth of the drain shallow trench isolation 202a is greater than the depth of the trench 211. A first side face of the gate conductive material layer 209 extends to the surface of the drain shallow trench isolation 202a.

The drain region 206a is formed in a surface region of the drain high voltage diffusion region 204a outside the first side face of the drain shallow trench isolation STI 202a.

The source structure includes a source high voltage diffusion region 204b and a source region 206b heavily doped with the first conductivity type ions. The source high voltage diffusion region 204b is formed in the first high voltage well region 203. The source region 206b is formed in a surface region of the source high voltage diffusion region 204b.

The first side face of the gate dielectric layer 208 extends into the drain high voltage diffusion region 204a. The second side face of the gate dielectric layer 208 extends into the source high voltage diffusion region 204b. A channel region is composed of the first high voltage well region 203 at the bottom of the gate dielectric layer 208.

When the HV device is switched on, a current between the channel region and the drain region 206a represented by a dashed line 401 is transmitted along a side face and a bottom surface of the drain shallow trench isolation 202a. When the side face of the drain shallow trench isolation 202a is more inclined, that is, an inclination angle is larger, the current is deeper and thus is farther away from a bottom sharp corner of the drain shallow trench isolation 202a, facilitating the improvement of device reliability. However, as the process node decreases, the improvement of the device reliability implemented by adjusting the inclination angle of the side face of the drain shallow trench isolation 202a is limited in an actual process, so a problem in the device reliability may still occur.

In the existing method, an etching region of the trench 211 is defined by using a mask of the gate conductive material layer 209. Referring to FIG. 3, a plurality of shallow trench isolations 202 are formed in the semiconductor substrate 201, a plurality of active regions are defined by means of the shallow trench isolations 202, a formation region of the shallow trench isolation 202 is a white region, all the active regions are marked with 201a, 201b, and 201c, respectively, and the drain shallow trench isolation 202a is located between the active regions 201b and 201c. Doped region structures formed in the active regions 201a, 201b, and 201c are not shown in FIG. 3. The drain region 206a is formed in the active region 201b, and the drain high voltage diffusion region 204a is mainly formed in the active region 201b and extends into the active region 201c. The gate conductive material layer 209 is represented by a dashed line, and it can be seen that the gate conductive material layer 209 mainly covers a selected region of the active region 201c and extends to the surface of the shallow trench isolation 202 outside the active region 201c. The etching region of the trench 211 is defined by using the mask of the gate conductive material layer 209. During etching of the trench 211, a surface region of the semiconductor substrate 201 in the active region 201c that is in a region covered by the gate conductive material layer 209 is etched, and the trench 211 is not formed in the shallow trench isolation 202 outside the active region 201c, that is, the etching region of the trench 211 is an overlap region between the gate conductive material layer 209 and the active region 201c.

The HV device shown in FIG. 2 is of an asymmetrical structure, with the source region 206b being self-aligned with the second side face of the gate dielectric layer 208. In FIG. 3, the source region 206b is formed in the active region 201c outside the region covered by the gate conductive material layer 209.

A peripheral high voltage diffusion region 205 doped with the second conductivity type is also formed in the first high voltage well region 203 on the periphery of the HV device. A substrate pickup region 207 heavily doped with the second conductivity type is formed on the surface of the peripheral high voltage diffusion region 205. The substrate pickup region 207 is electrically connected to the source region 206b. In FIG. 3, the peripheral high voltage diffusion region 205 is formed in the active region 201a, and it can be seen that the active region 201a presents an annular structure, that is, the two peripheral high voltage diffusion regions 205 shown in FIG. 2 are actually one and the same structure.

The HV device may also be of a symmetrical structure, with a source shallow trench isolation being formed in the source high voltage diffusion region 204b. The source shallow trench isolation is not shown in FIG. 2. A first side face of the source shallow trench isolation is aligned with the second side face of the gate dielectric layer 208, and the source region 206b is self-aligned with a second side face of the source shallow trench isolation. The source shallow trench isolation and the drain shallow trench isolation 202a present a symmetrical structure.

The HV device is an N type device, the first conductivity type is an N type, and the second conductivity type is a P type.

The semiconductor substrate 201 is P type doped. In FIG. 2, the semiconductor substrate 201 is also represented by P-sub, and the first high voltage well region 203 is also represented by HVPW, HVPW being the abbreviation of high voltage P type well. Both of the drain high voltage diffusion region 204a and the source high voltage diffusion region 204b are also represented by HVNDF, the HVNDF being the abbreviation of high voltage N type diffusion. The peripheral high voltage diffusion region 205 is also represented by HVPDF, HVPDF being the abbreviation of high voltage P type diffusion. The drain region 206a and the source region 206b are also represented by SDN, SDN representing N type source and drain region. The substrate pickup region 207 is also represented by SDP, SDP representing P type source and drain region. The shallow trench isolation 202 is also represented by STI.

A metal interconnection layer is also formed on the semiconductor substrate, and the metal interconnection layer is not shown in FIG. 2. The metal interconnection layer forms a plurality of front metal layer patterns and vias connecting the front metal layer patterns, ultimately forming a source, a drain, and a gate by patterning front metal layers.

The drain region 206a is connected to the drain, and the source region 206b and the substrate pickup region 207 are both connected to the source, that is, the source serves as a substrate bulk. The gate conductive material layer 209 is connected to the gate.

BRIEF SUMMARY

According to some embodiments in this application, a HV device includes: a gate dielectric layer, wherein the gate dielectric layer is formed in a first trench, the first trench is formed by etching a semiconductor substrate, and a top surface of the gate dielectric layer is flush with a top surface of the semiconductor substrate.

A gate conductive material layer is formed on the surface of the gate dielectric layer.

A first high voltage well region doped with a second conductivity type is formed on the semiconductor substrate.

A drain structure is formed in the first high voltage well region outside a first side face of the gate dielectric layer, and a source structure is formed in the first high voltage well region outside a second side face of the gate dielectric layer (at the right side of 308 in FIG. 4).

The drain structure includes a drain high voltage diffusion region doped with first conductivity type ions, a drain shallow trench isolation, and a drain region heavily doped with the first conductivity type.

The drain high voltage diffusion region is formed in the first high voltage well region, the drain shallow trench isolation is located in the drain high voltage diffusion region, and a second side face of the drain shallow trench isolation is aligned with a first side face of the first trench. The depth of the drain shallow trench isolation is greater than the depth of the first trench. A first side face of the gate conductive material layer extends to the surface of the drain shallow trench isolation.

The drain structure further includes a second dielectric layer formed in a second trench, and a second side face of the second trench is aligned with a first side face of the drain shallow trench isolation. The depth of the drain shallow trench isolation is greater than the depth of the second trench.

The drain region is formed in a surface region of the drain high voltage diffusion region outside a first side face of the second dielectric layer, and a junction depth of the drain region is less than the thickness of the second dielectric layer.

The source structure includes a source high voltage diffusion region and a source region heavily doped with the first conductivity type ions, the source high voltage diffusion region is formed in the first high voltage well region, and the source region is formed in a surface region of the source high voltage diffusion region.

The first side face of the gate dielectric layer extends into the drain high voltage diffusion region, and the second side face of the gate dielectric layer extends into the source high voltage diffusion region (at the right side of 308 in FIG. 4). A channel region is composed of the first high voltage well region at the bottom of the gate dielectric layer.

When the HV device is switched on, an electric carrier current between the channel region and the drain region is transmitted along the side faces and a bottom surface of the drain shallow trench isolation and a side face and a bottom surface of the second dielectric layer, and the second dielectric layer increases the depth of the current under the second dielectric layer between the channel region and the drain region, so as to improve device reliability.

In some cases, the first trench and the second trench are formed simultaneously by means of the same etching process.

The second dielectric layer and the gate dielectric layer are formed simultaneously by a similar process.

In some cases, an etching region of the second trench is formed by extending an etching region of the first trench.

In some cases, the etching region of the first trench is defined by using a mask of the gate conductive material layer.

In some cases, the material of the gate dielectric layer includes silicon oxide.

In some cases, the gate conductive material layer includes a metal gate.

In some cases, the HV device is of an asymmetrical structure, and the source region is self-aligned with the second side face of the gate dielectric layer (at the right side of 308 in FIG. 4).

Alternatively, the HV device has a symmetrical structure, its source shallow trench isolation is formed in the source high voltage diffusion region, the first side face of the source shallow trench isolation is aligned with the second side face of the gate dielectric layer, and the source region is self-aligned with a second side face of the source shallow trench isolation; and the source shallow trench isolation and the drain shallow trench isolation present a symmetrical structure.

In some cases, a peripheral high voltage diffusion region doped with the second conductivity type is also formed in the first high voltage well region on the periphery of the HV device, a substrate pickup region heavily doped with the second conductivity type ions is formed on the surface of the peripheral high voltage diffusion region, and the substrate pickup region is electrically connected to the source region.

In order to solve the above technical problem, the method for manufacturing an HV device provided by the present application includes the following steps:

step 1, providing a semiconductor substrate, wherein a first high voltage well region doped with a second conductivity type is formed on the semiconductor substrate, a drain high voltage diffusion region doped with a first conductivity type ions and a source high voltage diffusion region are formed in selected regions of the first high voltage well region, and a drain shallow trench isolation is formed in a selected region of the drain high voltage diffusion region;

step 2, defining an etching region of a first trench, and etching the semiconductor substrate in the etching region of the first trench to form the first trench, wherein a second side face of the drain shallow trench isolation is aligned with a first side face of the first trench, and the depth of the drain shallow trench isolation is greater than the depth of the first trench; and defining an etching region of a second trench, and etching the semiconductor substrate in the etching region of the second trench to form the second trench, wherein a second side face of the second trench is aligned with a first side face of the drain shallow trench isolation, and the depth of the drain shallow trench isolation is greater than the depth of the second trench;

step 3, filling the first trench with a gate dielectric layer, and filling the second trench with a second dielectric layer, wherein a top surface of the gate dielectric layer and a top surface of the second dielectric layer are both flush with a top surface of the semiconductor substrate;

a first side face of the gate dielectric layer extends into the drain high voltage diffusion region, and a second side face of the gate dielectric layer extends into the source high voltage diffusion region; and a channel region is composed of the first high voltage well region at the bottom of the gate dielectric layer;

step 4, forming a gate conductive material layer, wherein the gate conductive material layer is located on the surface of the gate dielectric layer and extends to the surface of the drain shallow trench isolation; and step 5, performing source and drain injection heavily doped with the first conductivity type ions to form a source region and a drain region, wherein the drain region is formed in a surface region of the drain high voltage diffusion region outside a first side face of the second dielectric layer in a self-aligned manner, and a junction depth of the drain region is less than the thickness of the second dielectric layer;

the source region is formed in a surface region of the source high voltage diffusion region;

a drain structure is located in the first high voltage well region outside the first side face of the gate dielectric layer, and a source structure is located in the first high voltage well region outside the second side face of the gate dielectric layer;

the drain structure includes the drain high voltage diffusion region, the drain shallow trench isolation, the second dielectric layer, and the drain region;

the source structure includes the source high voltage diffusion region and the source region; and when the HV device is switched on, a current between the channel region and the drain region is transmitted along the first and second side faces and a bottom surface of the drain shallow trench isolation and a side face and a bottom surface of the second dielectric layer, and the second dielectric layer increases the depth of the current under the second dielectric layer between the channel region and the drain region, so as to improve device reliability.

In some cases, the first trench and the second trench are formed simultaneously by means of the same etching process in step 2.

The second dielectric layer and the gate dielectric layer are formed simultaneously a similar process in step 3.

In some cases, the etching region of the second trench is formed by extending the etching region of the first trench in step 2.

In some cases, the etching region of the first trench is defined by using a mask of the gate conductive material layer.

In some cases, the material of the gate dielectric layer in step 3 includes silicon oxide.

In some cases, the gate conductive material layer in step 4 includes a metal gate.

In some cases, the HV device is of an asymmetrical structure, and the source region is self-aligned with the second side face of the gate dielectric layer in step 5.

Alternatively, the HV device is of a symmetrical structure, a source shallow trench isolation is formed in the source high voltage diffusion region in step 1, a first side face of the source shallow trench isolation is aligned with the second side face of the gate dielectric layer in step 3, and the source region is self-aligned to a second side face of the source shallow trench isolation in step 5; and the source shallow trench isolation and the drain shallow trench isolation present a symmetrical structure.

In some cases, a peripheral high voltage diffusion region doped with the second conductivity type ions is also formed in the first high voltage well region on the periphery of the HV device in step 1.

After step 5, the method further includes performing source and drain injection heavily doped with the second conductivity type to form a substrate pickup region on the surface of the peripheral high voltage diffusion region, and the substrate pickup region is electrically connected to the source region.

In the present application, the second trench is provided on the first side face of a side of the drain shallow trench isolation close to the drain region and the second trench is filled with the second dielectric layer. Compared to the separate drain shallow trench isolation, an integral structure formed by the second dielectric layer and the drain shallow trench isolation has a step structure on a first side face of the integral structure, equivalent to increasing an inclination angle of the first side face of the drain shallow trench isolation, and thereby increasing the depth of the current under the second dielectric layer between the channel region and the drain region and making the current away from the sharp corner of the drain shallow trench isolation. Therefore, the present application can alleviate the adverse impact of the drain shallow trench isolation on the current and particularly alleviate the adverse impact of the bottom sharp corner of the drain shallow trench isolation on the current, thereby improving the device reliability.

BRIEF DESCRIPTION OF THE DRAWINGS

The present application will be further described in detail below with reference to the drawings and specific implementations.

DETAILED DESCRIPTION OF THE DISCLOSURE

Figure 4:
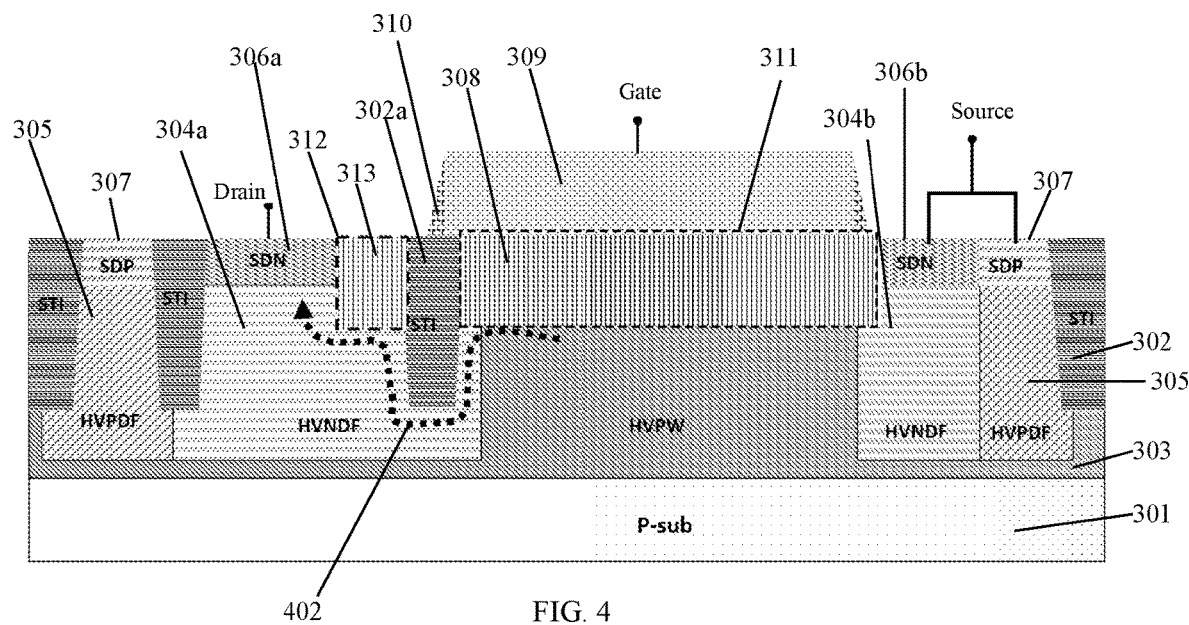
FIG. 4 is a schematic diagram of an HV device structure according to an embodiment of the present application.
Figure 5:
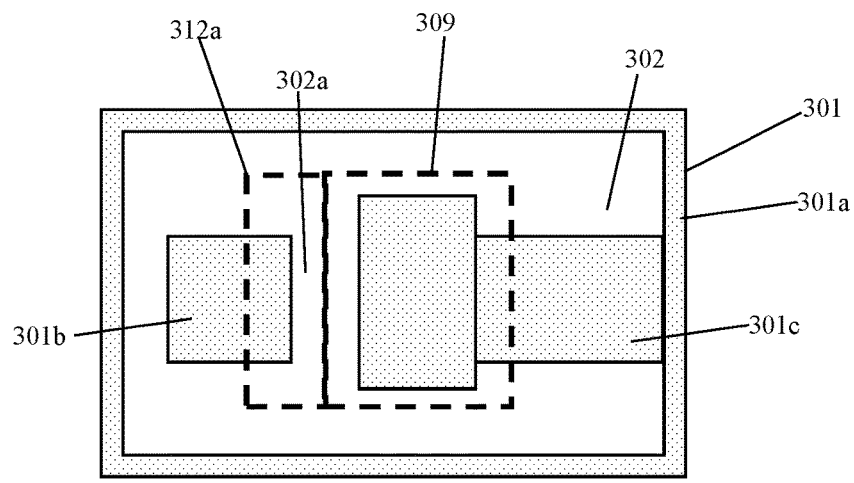
FIG. 5 is a schematic layout top view of the HV device according to an embodiment of the present application.

FIG. 4 is a schematic diagram of an HV device structure according to one embodiment of the present application. FIG. 5 is a schematic layout top view of the HV device according to this embodiment of the present application. In FIG. 4, an HV device having an asymmetrical structure and an N-type device is illustrated as an example of this embodiment of the present application. The disclosed HV device according to this embodiment includes:

a gate dielectric layer 308, wherein the gate dielectric layer 308 is formed in a first trench 311, the first trench 311 is formed by etching a semiconductor substrate 301, and a top surface of the gate dielectric layer 308 is flush with a top surface of the semiconductor substrate 301.

A gate conductive material layer 309 is formed on the surface of the gate dielectric layer 308.

The gate conductive material layer 309 includes a metal gate.

Sidewall spacers 310 are formed on side faces of the gate conductive material layer 309.

A first high voltage well region 303 doped with second conductivity type ions is formed on the semiconductor substrate 301.

A drain structure is formed in the first high voltage well region 303 outside a first side face (at the left side) of the gate dielectric layer 308, and a source structure is formed in the first high voltage well region 303 outside a second side face (at the right side) of the gate dielectric layer 308.

The drain structure includes a drain high voltage diffusion region 304a doped with a first conductivity type ions, a drain shallow trench isolation 302a, and a drain region 306a heavily doped with the first conductivity type ions.

The drain high voltage diffusion region 304a is formed in the first high voltage well region 303, the drain shallow trench isolation 302a is located in the drain high voltage diffusion region 304a, and a second side face (at the right side) of the drain shallow trench isolation 302a is aligned with a first side face (at the left side) of the first trench 311. Herein the depth of the drain shallow trench isolation 302a is greater than the depth of the first trench 311. A first side face of the gate conductive material layer 309 extends to the surface of the drain shallow trench isolation 302a.

The drain structure further includes a second dielectric layer 313 formed in a second trench 312, and a second side face (at the right side) of the second trench 312 is aligned with a first side face (at the left side) of the drain shallow trench isolation 302a. The depth of the drain shallow trench isolation 302a is greater than the depth of the second trench 312.

The drain region 306a is formed in a surface region of the drain high voltage diffusion region 304a outside a first side face of the second dielectric layer 313, and a junction depth of the drain region is less than the thickness of the second dielectric layer 313.

The source structure includes a source high voltage diffusion region 304b and a source region 306b heavily doped with the first conductivity type ions, the source high voltage diffusion region 304b is formed in the first high voltage well region 303, and the source region 306b is formed in a surface region of the source high voltage diffusion region 304b.

The first side face of the gate dielectric layer 308 extends into the drain high voltage diffusion region 304a, and the second side face (the right side) of the gate dielectric layer 308 extends into the source high voltage diffusion region 304b. A channel region includes the first high voltage well region 303 at the bottom of the gate dielectric layer 308.

Figure 1A:
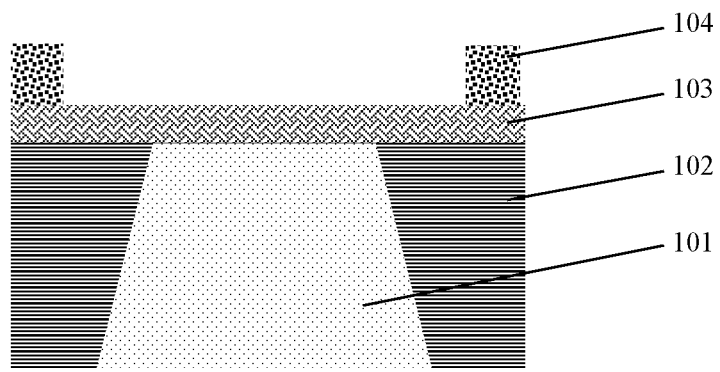
FIGS. 1A-1C are schematic diagrams of device structures obtained in steps of forming a gate dielectric layer in an existing method for manufacturing an HV device.
Figure 1B:
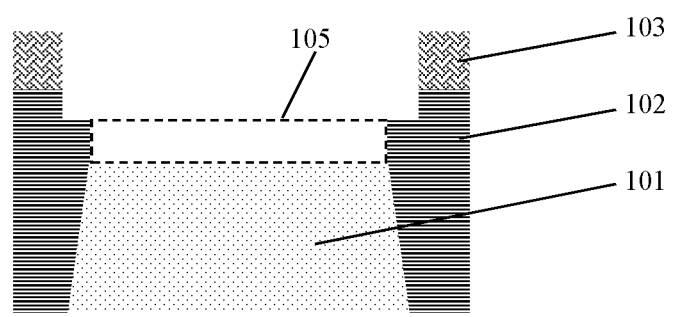
Figure 1C:
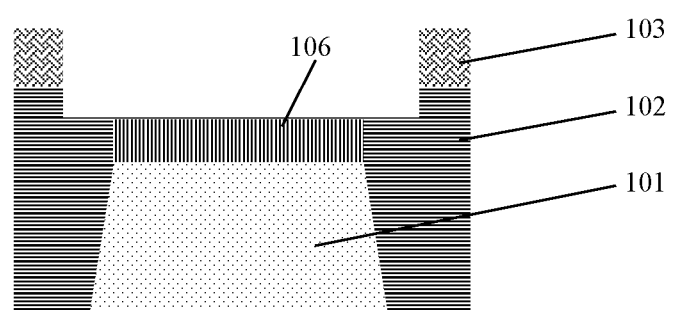
Figure 2:
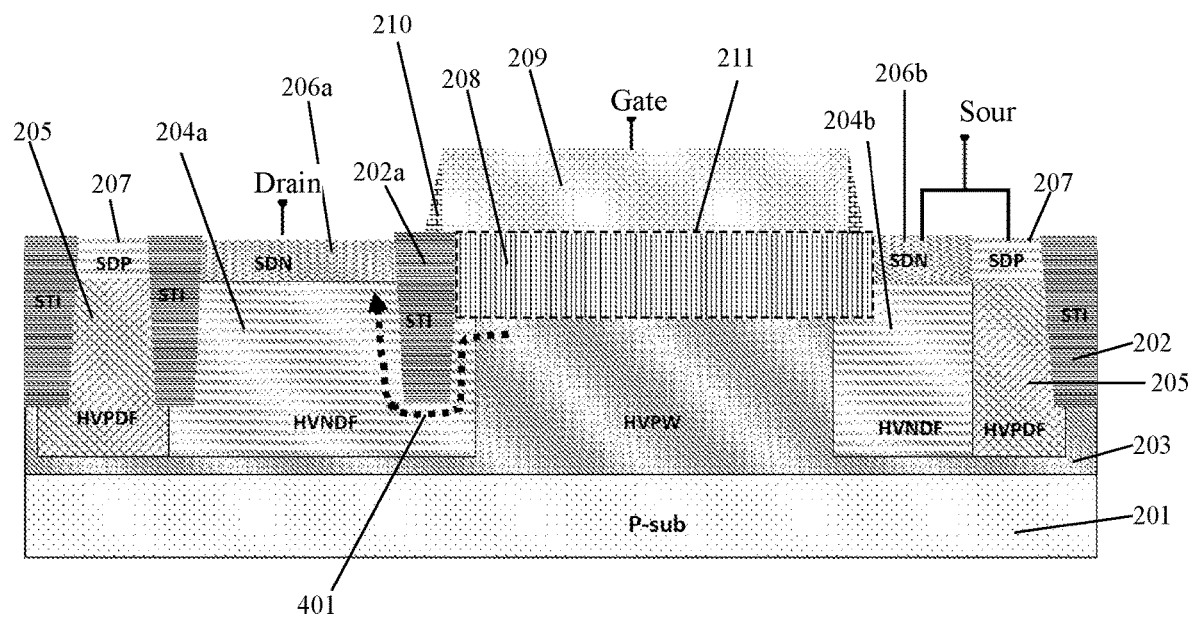
FIG. 2 is a schematic diagram of a structure of an existing HV device.
Figure 3:
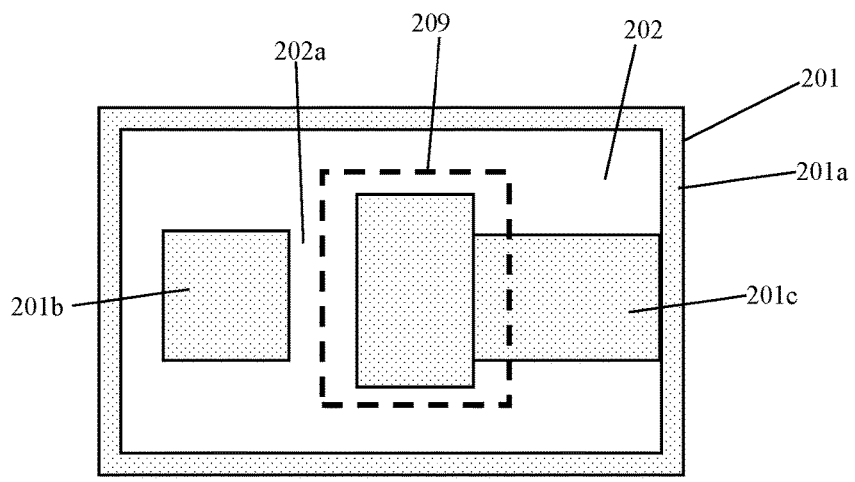
FIG. 3 is a schematic layout top view of the existing HV device.

When the HV device is switched on, an electric current between the channel region and the drain region 306a is transmitted along side faces and a bottom surface of the drain shallow trench isolation 302a and a side face and a bottom surface of the second dielectric layer 313, and the second dielectric layer 313 is built to increase the depth of the current between the channel region and the drain region 306a, so as to improve device reliability. In FIG. 4, a dashed line 402 represents the current between the channel region and the drain region 306a including an area under the second dielectric layer. Compared to a current represented by a dashed line 401 in FIG. 2, the current in a formation region of the second dielectric layer 313 in this embodiment of the present application made deeper from a surface region of the semiconductor substrate 301 to a bottom region of the second dielectric layer 313. Therefore, the current in this embodiment of the present application is further away from the surface of the semiconductor substrate 301, thereby increasing device reliability. In addition, in a bottom region of the drain shallow trench isolation 302a, the depth of the current is also increased, increasing a distance between the current and a bottom corner of the drain shallow trench isolation 302a, alleviating an adverse impact of the drain shallow trench isolation 302a on the current, and thereby further increasing the device reliability.

In this embodiment of the present application, the first trench 311 and the second trench 312 are formed simultaneously by a similar etching process.

The second dielectric layer 313 and the gate dielectric layer 308 are formed simultaneously by a similar process.

The material of the gate dielectric layer 308 includes silicon oxide.

An etching region of the second trench 312 is formed by extending an etching region of the first trench 311.

The etching region of the first trench 311 is defined by using a mask of the gate conductive material layer 309.

Referring to FIG. 5, a plurality of shallow trench isolations 302 are formed in the semiconductor substrate 301, a plurality of active regions are defined by the shallow trench isolations 302, a formation region of the shallow trench isolation 302 is the white region inside the enclosing frame 301, all the active regions are marked with 301a, 301b, and 301c, respectively, and the drain shallow trench isolation 302a is located between the active regions 301b and 301c. Doped structures formed in the active regions 301a, 301b, and 301c are not shown in FIG. 5. The drain region 306a is formed in the active region 301b, and the drain high voltage diffusion region 304a is mainly formed in the active region 301b and extends into the active region 301c. The gate conductive material layer 309 is represented by a dashed line, and it can be seen that the gate conductive material layer 309 mainly covers a selected region of the active region 301c and extends to the surface of the shallow trench isolation 302 outside the active region 301c. The etching region of the trench 311 is defined by using the mask of the gate conductive material layer 309. During etching of the trench 311, a surface region of the semiconductor substrate 301 in the active region 301c that is in a region covered by the gate conductive material layer 309 is etched, and the trench 311 is not formed in the shallow trench isolation 302 outside the active region 301c, that is, the etching region of the trench 311 is an overlap region between the gate conductive material layer 309 and the active region 301c.

The etching region of the second trench 312 is formed by extending the etching region of the first trench 311. In FIG. 5, a dashed line box 312a represents an extension region, and an overlap region between the dashed line box 312a and the active region 301b is a formation region of the second trench 312. The definition of the etching regions of the first trench 311 and the second trench 312 can be achieved by directly applying a mask of a combined region consisting of the gate conductive material layer 309 and the dashed line box 312a.

In this embodiment of the present application, the HV device is of an asymmetrical structure, and the source region 306b is self-aligned with the second side face (at the right side) of the gate dielectric layer 308. In FIG. 5, the source region 306b is formed in the active region 301c outside the region covered by the gate conductive material layer 309.

In some other embodiments, the second dielectric layer 313 and the gate dielectric layer 308 may also be formed by means of different processes. For example, when the gate dielectric layer 308 is of a high dielectric constant material, the second dielectric layer 313 may be of a material different from that of the gate dielectric layer 308, e.g., the second dielectric layer 313 is of silicon oxide.

In this embodiment of the present application, the HV device has an asymmetrical structure, and the source region 306b is self-aligned with the second side face (at the right side) of the gate dielectric layer 308.

A peripheral high voltage diffusion region 305 doped with the second conductivity type is ions is also formed in the first high voltage well region 303 on the periphery of the HV device, a substrate pickup region 307 heavily doped with the second conductivity type is formed on the surface of the peripheral high voltage diffusion region 305, and the substrate pickup region 307 is electrically connected to the source region 306b. In FIG. 5, the peripheral high voltage diffusion region 305 is formed in the active region 301a. It can be seen that the active region 301a presents an annular structure, that is, the two peripheral high voltage diffusion regions 305 shown in FIG. 4 are actually one and the same structure.

In other embodiments, alternatively, the HV device is of a symmetrical structure, a source shallow trench isolation is formed in the source high voltage diffusion region 304b. The source shallow trench isolation is not shown in FIG. 4. A first side face of the source shallow trench isolation is aligned with the second side face of the gate dielectric layer 308 (at the right side of 308 in FIG. 4), and the source region 306b is self-aligned with the second side face of the source shallow trench isolation. The source shallow trench isolation and the drain shallow trench isolation 302a present a pair of symmetrical structures.

In this embodiment of the present application, the HV device is an N type device, the first conductivity type is an N type, and the second conductivity type is a P type. In other embodiments, the HV device may also be a P type device, the first conductivity type is a P type, and the second conductivity type is an N type.

The semiconductor substrate 301 is P type doped. In FIG. 4, the P-type semiconductor substrate 301 is also represented by P-sub, and the first high voltage well region 303 is also represented by HVPW, where HVPW is the abbreviation of high voltage P-type well. Both of the drain high voltage diffusion region 304a and the source high voltage diffusion region 304b are also represented by HVNDF, where the HVNDF is the abbreviation of high voltage N type diffusion. The peripheral high voltage diffusion region 305 is also represented by HVPDF, where HVPDF is the abbreviation of high voltage P-type diffusion. The drain region 306a and the source region 306b are also represented by SDN, where SDN represents N-type source and drain region. The substrate pickup region 307 is also represented by SDP, where SDP represents P-type source and drain region. The shallow trench isolation 302 is also represented by STI.

A metal interconnection layer is also formed on the semiconductor substrate, and the metal interconnection layer is not shown in FIG. 4. The metal interconnection layer forms a plurality of front metal layer patterns and vias connecting the front metal layer patterns, ultimately forming a source, a drain, and a gate by patterning front metal layers.

The drain region 306a is connected to the drain, and the source region 306b and the substrate pickup region 307 are both connected to the source, that is, the source serves as a substrate bulk. The gate conductive material layer 309 is connected to the gate.

In this embodiment of the present application, the second trench 312 is provided on the first side face of a side of the drain shallow trench isolation 302a close to the drain region 306a and the second trench 312 is filled with the second dielectric layer 313. Compared to the separate drain shallow trench isolation 302a, an integral structure formed by the second dielectric layer 313 and the drain shallow trench isolation 302a has a step structure on a first side face of the integral structure, equivalent to increasing an inclination angle of the first side face of the drain shallow trench isolation 302a, and thereby increasing the depth of the current between the channel region and the drain region 306a including under the second dielectric layer and making the current away from the sharp corners of the drain shallow trench isolation 302a. Therefore, this embodiment of the present application can alleviate the adverse impact of the drain shallow trench isolation 302a on the current and particularly alleviate the adverse impact of the bottom sharp corners of the drain shallow trench isolation 302a on the current, thereby improving the device reliability.

A method for manufacturing an HV device according to this embodiment of the present application includes the following steps:

Step 1. A semiconductor substrate 301 is provided, wherein a first high voltage well region 303 doped with a second conductivity type ions is formed on the semiconductor substrate 301, a drain high voltage diffusion region 304a doped with first conductivity type ions and a source high voltage diffusion region 304b are formed in selected regions of the first high voltage well region 303, and a drain shallow trench isolation 302a is formed in a selected region of the drain high voltage diffusion region 304a.

In the method according to this embodiment of the present application, a peripheral high voltage diffusion region 305 doped with the second conductivity type is also formed in the first high voltage well region 303 on the periphery of the HV device.

In addition to the shown drain shallow trench isolation 302a, a plurality of shallow trench isolations 302 are also provided at other positions. Referring to FIG. 5, the shallow trench isolations 302 enclose a plurality of active regions in the semiconductor substrate 301, and active regions 301a, 301b, and 301c are shown in FIG. 5.

Step 2. An etching region of a first trench 311 is defined, and the semiconductor substrate 301 in the etching region of the first trench 311 is etched to form the first trench 311, wherein a second side face of the drain shallow trench isolation 302a is aligned with a first side face of the first trench 311, and the depth of the drain shallow trench isolation 302a is greater than the depth of the first trench 311.

An etching region of a second trench 312 is defined, and the semiconductor substrate 301 in the etching region of the second trench 312 is etched to form the second trench 312, wherein a second side face of the second trench 312 is aligned with a first side face of the drain shallow trench isolation 302a, and the depth of the drain shallow trench isolation 302a is greater than the depth of the second trench 312.

In the method according to this embodiment of the present application, the first trench 311 and the second trench 312 are formed simultaneously by means of the same etching process.

The etching region of the second trench 312 is formed by extending the etching region of the first trench 311.

The etching region of the first trench 311 is defined by using a mask of the gate conductive material layer 309.

Referring to FIG. 5, the etching regions of the first trench 311 and the second trench 312 may be defined simultaneously by extending a region defined by the mask of the gate conductive material layer 309 into a dashed line box 312a. The etching region of the first trench 311 is an overlap region between the gate conductive material layer 309 and the active region 301c. The etching region of the second trench 312 is an overlap region between the dashed line box 312a and the active region 301b.

Step 3. The first trench 311 is filled with a gate dielectric layer 308, and the second trench 312 is filled with a second dielectric layer 313.

A top surface of the gate dielectric layer 308 and a top surface of the second dielectric layer 313 are both flush with a top surface of the semiconductor substrate 301.

A first side face of the gate dielectric layer 308 extends into the drain high voltage diffusion region 304a, and a second side face (at the right side pf 308 in FIG. 4) of the gate dielectric layer 308 extends into the source high voltage diffusion region 304b. A channel region is composed of the first high voltage well region 303 at the bottom of the gate dielectric layer 308.

In the method according to this embodiment of the present application, the second dielectric layer 313 and the gate dielectric layer 308 are formed simultaneously by a similar process.

The material of the gate dielectric layer 308 includes silicon oxide.

Step 4. A gate conductive material layer 309 is formed, wherein the gate conductive material layer 309 is located on the surface of the gate dielectric layer 308 and extends to the surface of the drain shallow trench isolation 302a.

In the method according to this embodiment of the present application, the gate conductive material layer 309 includes a metal gate.

A sidewall spacer 310 is formed on a side face of the gate conductive material layer 309.

Step 5. Source and drain injection is heavily doped with the first conductivity type ions, thus, a source region 306b and a drain region 306a are formed.

The drain region 306a is formed in a surface region of the drain high voltage diffusion region 304a outside the first side face (at the left side) of the second dielectric layer 313 in a self-aligned manner, and a junction depth of the drain region 306a is less than the thickness of the second dielectric layer 313.

The source region 306b is formed in a surface region of the source high voltage diffusion region 304b.

A drain structure is located in the first high voltage well region 303 outside the first side face of the gate dielectric layer 308, and a source structure is located in the first high voltage well region 303 outside the second side face (at the right side) of the gate dielectric layer 308.

The drain structure includes the drain high voltage diffusion region 304a, the drain shallow trench isolation 302a, the second dielectric layer 313, and the drain region 306a.

The source structure includes the source high voltage diffusion region 304b and the source region 306b.

When the HV device is switched on, a current between the channel region and the drain region 306a is transmitted along the side faces and a bottom surface of the drain shallow trench isolation 302a and a side face and a bottom surface of the second dielectric layer 313, and the second dielectric layer 313 is used to increase the depth of the current between the channel region and the drain region 306a including under the second dielectric layer so as to improve device reliability.

In the method according to this embodiment of the present application, the HV device has an asymmetrical structure, and the source region 306b is self-aligned with the second side face of the gate dielectric layer 308 in step 5. In methods of other embodiments, alternatively, the HV device can have a symmetrical structure. A source shallow trench isolation is formed in the source high voltage diffusion region 304b in step 1. A first side face (at the left side) of the source shallow trench isolation is aligned with the second side face (at the right side) of the gate dielectric layer 308 in step 3. The source region 306b is self-aligned with a second side face (at the left side) of the source shallow trench isolation in step 5. The source shallow trench isolation 302 and the drain shallow trench isolation 302 present are a pair of symmetrical structures.

After step 5, the method according to this embodiment of the present application further includes performing source and drain injection heavily doped second conductivity type ions to form a substrate pickup region 307 on the surface of the peripheral high voltage diffusion region 305, and the substrate pickup region 307 is electrically connected to the source region 306b.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. A method for manufacturing a high voltage (HV) device, comprising following steps:

step 1, providing a semiconductor substrate, forming a first high voltage well region doped with ions of a second conductivity type on the semiconductor substrate, forming a drain high voltage diffusion region doped with ions of a first conductivity type and a source high voltage diffusion region in selected regions of the first high voltage well region, and forming a drain shallow trench isolation in a selected region of the drain high voltage diffusion region;

step 2, patterning a first trench on the semiconductor substrate, wherein a second side face of the drain shallow trench isolation is aligned with a first side face of the first trench, wherein a depth of the drain shallow trench isolation is greater than a depth of the first trench; and patterning a second trench on the semiconductor substrate, wherein a second side face of the second trench is aligned with a first side face of the drain shallow trench isolation, wherein the depth of the drain shallow trench isolation is greater than a depth of the second trench;

step 3, filling the first trench with a gate dielectric layer, and filling the second trench with a second dielectric layer, wherein a top surface of the gate dielectric layer and a top surface of the second dielectric layer are both flush with a top surface of the semiconductor substrate;

wherein a first side face of the gate dielectric layer extends into the drain high voltage diffusion region, and a second side face of the gate dielectric layer extends into the source high voltage diffusion region; and a channel region is located in the first high voltage well region at a bottom surface of the gate dielectric layer;

step 4, forming a gate conductive material layer, wherein the gate conductive material layer is located on the top surface of the gate dielectric layer and extends to the second side face of the drain shallow trench isolation; and step 5, performing source and drain injection by heavily doping ions of the first conductivity type to form a source region and a drain region, wherein the drain region is formed in a surface region of the drain high voltage diffusion region outside a first side face of the second dielectric layer in a self-aligned manner, and wherein a junction depth of the drain region is less than a thickness of the second dielectric layer;

wherein the source region is formed in a surface region of the source high voltage diffusion region;

wherein a drain structure is formed in the first high voltage well region outside the first side face of the gate dielectric layer, and wherein a source structure is located in the first high voltage well region outside the second side face of the gate dielectric layer;

wherein the drain structure comprises the drain high voltage diffusion region, the drain shallow trench isolation, the second dielectric layer, and the drain region;

wherein the source structure comprises the source high voltage diffusion region and the source region; and wherein, when the HV device is switched on, a current between the channel region and the drain region is transmitted along the first side face and the second side face and a bottom surface of the drain shallow trench isolation and the first side face and a bottom surface of the second dielectric layer, and wherein the second dielectric layer increases a depth of the current under the second dielectric layer between the channel region and the drain region, so as to improve device reliability.

2. The method for manufacturing the HV device according to claim 1, wherein the first trench and the second trench are formed simultaneously by a same etching process in step 2; and wherein the second dielectric layer and the gate dielectric layer are formed simultaneously by a same process in step 3.

3. The method for manufacturing the HV device according to claim 2, wherein the patterning the second trench on the semiconductor substrate comprises extending an etching region of the first trench in step 2.

4. The method for manufacturing the HV device according to claim 3, wherein the patterning the first trench comprises patterning the first trench with a mask of the gate conductive material layer.

5. The method for manufacturing the HV device according to claim 2, wherein a material of the gate dielectric layer in step 3 comprises silicon oxide.

6. The method for manufacturing the HV device according to claim 5, wherein the gate conductive material layer in step 4 comprises a metal gate.

7. The method for manufacturing the HV device according to claim 1, wherein the source structure and the drain structure are arranged as either an asymmetrical structure or a symmetrical structure, wherein, in the asymmetrical structure, the source region is self-aligned with the second side face of the gate dielectric layer in step 5;

wherein, in the symmetrical structure, the source structure further comprises a source shallow trench isolation formed in the source high voltage diffusion region, in step 1; wherein a first side face of the source shallow trench isolation is aligned with the second side face of the gate dielectric layer, in step 3; and wherein the source region is self-aligned with a second side face of the source shallow trench isolation in step 5.

8. The method for manufacturing the HV device according to claim 1, wherein a peripheral high voltage diffusion region doped with ions of the second conductivity type is also formed in the first high voltage well region on a periphery of the HV device in step 1; and wherein, after step 5, the method further comprises performing injection by heavily doped ions of the second conductivity type to form a substrate pickup region on a surface of the peripheral high voltage diffusion region, and wherein the substrate pickup region is electrically connected to the source region.

* * * * *